United States Patent [19]

Watanabe et al.

[11] Patent Number: 5,497,545

[45] Date of Patent: Mar. 12, 1996

[54] METHOD OF MAKING ELECTRICAL CONNECTIONS IN THE MANUFACTURE OF WIRING SHEET ASSEMBLIES

[75] Inventors: Ryuji Watanabe, Tokai; Osamu Miura; Kunio Miyazaki, both of Hitachi; Yukio Ookoshi, Mito; Akio Takahashi, Hitachioota, all of Japan

[73] Assignee: Hitachi, Ltd., Tokyo, Japan

[21] Appl. No.: 34,372

[22] Filed: Mar. 18, 1993

[30] Foreign Application Priority Data

Mar. 19, 1992  [JP]  Japan ................................. 4-063146

[51] Int. Cl.⁶ ............................. H05K 3/36; H05K 3/40; H05K 3/46; H01R 9/09
[52] U.S. Cl. .................................. 29/830; 29/843; 29/844; 174/263; 174/265; 228/254; 439/83; 439/84
[58] Field of Search ...................... 29/830, 831, 843–845, 29/852, 853, 839; 228/56.3, 215, 254, 255; 439/83, 84; 361/406, 409; 174/262–265

[56] References Cited

U.S. PATENT DOCUMENTS

| | | | |
|---|---|---|---|
| 2,990,533 | 6/1961 | Hughes et al. | 439/84 |
| 3,103,547 | 9/1963 | Ansley | 439/83 X |
| 3,201,851 | 8/1965 | Stearns | 29/853 |
| 3,281,923 | 11/1966 | Best et al. | 29/844 |
| 3,445,929 | 5/1969 | Wolf | 29/844 |
| 3,446,908 | 5/1969 | Tally et al. | 439/84 X |
| 3,926,360 | 12/1975 | Moister, Jr. | 228/254 X |
| 4,727,633 | 3/1988 | Herrick | 228/254 X |
| 4,730,086 | 3/1988 | Kanijo et al. | 439/84 X |
| 4,881,906 | 11/1989 | Mackanic et al. | 29/843 X |
| 5,024,372 | 6/1991 | Altman et al. | 228/215 X |

FOREIGN PATENT DOCUMENTS

| | | | |
|---|---|---|---|
| 40905 | 12/1981 | European Pat. Off. | |
| 227066 | 7/1987 | European Pat. Off. | 29/830 |
| 2137227 | 12/1972 | France . | |
| 208751 | 11/1984 | Japan . | |
| 148878 | 6/1990 | Japan | 439/84 |
| 1260468 | 11/1972 | United Kingdom | 29/830 |

OTHER PUBLICATIONS

IBM Technical Disclosure Bulletin, vol. 21, No. 12, May 1979, pp. 4798–4799.
Bachmann "Excimer Lasers . . . Circuit Board" Chemtronics, vol. 4, Sep. 1989, pp. 149–152.
IBM Technical Disclosure Bulletin, vol. 15, No. 8, Jan. 1973, p. 2492.

*Primary Examiner*—Peter Vo
*Attorney, Agent, or Firm*—Antonelli, Terry, Stout & Kraus

[57] ABSTRACT

A multi-layer wiring assembly including a stack of insulating layers, e.g. of polyimide, alternating with wiring patterns, typically of copper. To establish the circuit pattern, successive wiring patterns are connected to one another through the intervening insulating layers at predetermined locations, by metal stud connections. The studs are formed during assembly of the stack by wire-bonding a stud onto an underlying wiring pattern through a through-hole of the insulating layer above, and then stamping the exposed end of the wire-bonded stud to spread it into contact with the uppermost wiring pattern. The wire-bonded studs e.g. of Au, form strong bonds with the underlying conductor and are quick to apply in an automated process using a wire-bonding machine.

20 Claims, 4 Drawing Sheets

METHOD OF MAKING ELECTRICAL CONNECTIONS IN THE MANUFACTURE OF WIRING SHEET ASSEMBLIES

FIELD OF THE INVENTION

This invention relates to the manufacture of wiring sheet assemblies, e.g. such as are typically used for the mounting of integrated circuit chips. In particular, the invention is concerned with the manner in which electrical connections are formed between successive conductive layers of the wiring sheet assembly which are separated by insulating layers.

BACKGROUND OF THE INVENTION

Multilayer wiring sheets are used conventionally in electronic computer circuitry. The operating speeds of computers are continuously increasing. To achieve a high operating speed, high speed signal transmission is needed. For high speed transmission, signal delay must be minimised at every part of the system, including the wiring assembly connecting to the integrated circuitry.

A typical layered wiring assembly has a ceramics substrate on which are laminated one or more insulating films. The insulating films support and separate conductive circuit layers, usually of copper. In conventional manufacture, insulator layers and patterned circuit layers are layered progressively onto the ceramics substrate, with each conductive layer being connected to the preceding one at the desired locations through through-holes of the insulator layers, at each stage of the process.

The number of electrical connections to be made in this sequential lamination process may be very large, typically thousands per layer. The best conventional process uses localised metal plating, typically electroless plating of copper, to plate through the through-holes (or "vias") and thereby connect an underlying conductor with a connection pad, adjacent the through-hole, of the upper conductor. The plating process involves many heat cycles and chemical treatment steps, and the resulting plated junction is liable both to damage and to peeling from the pad portions. It is therefore expensive, and the reliability problem makes it hard to achieve wiring assemblies having large numbers of layers e.g. more than ten.

Another conventional method uses a conductive solder paste whereof a lump is placed in the through-hole and fused by heating so that its top flows over the exposed conductor. The conductivity of these solder pastes is low, so they are inappropriate for high-speed signal transmission. They are also liable to cracking, and their adhesion to the conductors is not good.

SUMMARY OF THE INVENTION

An object of this invention is to provide a novel interconnection method for wiring sheet assemblies.

Another object of the invention is to provide wiring sheet assemblies incorporating novel electrical connections.

In this invention, we form an electrical connection between conductors separated by an insulating layer of a wiring sheet assembly by forming a through hole overlying one of the conductors, bonding a metal stud, preferably of a metal having an electrical resistivity not greater than 3 $\mu\Omega$.cm, onto the conductor through the through-hole, and then pressing the exposed end of the metal stud so that it is mechanically spread into contact with the conductor at the exposed surface.

Preferably the stud is bonded to the underlying conductor by forming a metallurgical bond using applied heat, pressure and preferably also ultrasound. In particular, it is preferred that such a bond be formed by a wire-bonding technique, in which the stud is formed by first bonding the end of a wire onto the underlying conductor and then separating the bonded end from the remainder of the wire to form the stud. This technique has a great practical advantage, since it can be carried out using wire-bonding steps which are in themselves conventional, and for which suitable apparatus is readily available or can conveniently be adapted. The conventional wire-bonding process, originally developed by Matsushita and now well known, is used for bonding connecting wires onto chip bonding pads. For the present process, that method can be adapted to include the step of detaching the bonded end from the remainder of the wire to form or partially form the stud.

The pressing of the exposed end of the stud may be carried out by any suitable mechanical presser e.g. a stamper (stamping in a direction down onto the stud) or a roller. Stamping has the advantage that it is conveniently combined with the direction of operation of a bonding machine which has means for downward pressing for bonding. For example, a stamping head may be associated with the pressing capillary used in wire-bonding.

The use of mechanical pressing, as opposed to the reflow melting used in the prior art solder paste process, is advantageous. Firstly it avoids a heating step, while nevertheless helping to ensure that the through-hole is filled by the stud so that good conduction is obtained. Secondly, it becomes possible to form the exposed end of the stud with a flat top. This contrasts with the rounded dome created by reflow, facilitates the application of subsequent layers without undesirable voids and irregularities, and thereby contributes to production reliability. Thirdly, it presses the flange positively into contact with the uppermost conductor. If desired, the pressing may incorporate additional bonding conditions such as heat and/or ultrasound, to form a metallurgical bond to the upper conductor.

The present method is of course also superior to the solder paste reflow method in that materials of very high conductivity, generally of resistivity less than 3 $\mu\Omega$.cm for example gold, copper or aluminum, may be used. Nevertheless, the technique offers substantial processing advantages e.g. in the manufacture of non-high-speed circuitry, even if lower conductivity materials such as tin/lead solder are used.

If desired, the underlying conductor may be plated before the stud is applied.

The technique may be used to connect one patterned wiring layer to another through an intervening insulator layer. It may also be used with advantage to connect the wiring layer of a lowermost insulating layer through to the connector terminals of a substrate of the wiring assembly, typically a substrate of ceramics or silicon. These terminals, commonly of tungsten, may be plated before the stud is applied.

Embodiments of the invention are now described by way of example, with reference to the accompanying drawings.

DETAILED DESCRIPTION OF THE PREFERRED EMBODIMENTS

Figure 1:
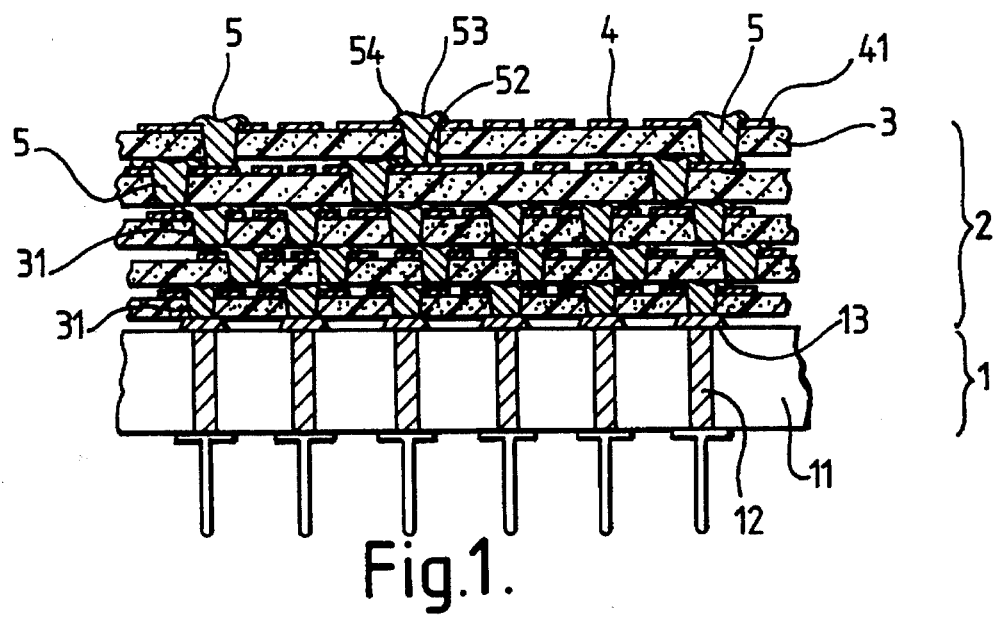
FIG. 1 is a sectional view of a multi-layer wiring board assembly.

FIG. 1 shows in section part of a multilayer wiring board comprising a stack 2 of wiring sheets superimposed on a stiff substrate 1.

The substrate 1 is of a generally conventional type. Its main layer 11 may be of e.g. ceramics, glass ceramics, silicon, glass-epoxy, glass-polyimide, epoxy reinforced with organic fibre (e.g. aramid), polyimide reinforced with organic fibre, or the like. Ceramics, glass-epoxy and glass-polyimide are preferred because they have a good combination of heat resistance, flexibility, moisture resistance, electrical resistance and dimensional stability. In this particular embodiment, a 3 mm mullite layer 11 was used. Terminal pins 12 for making electrical connections, e.g. to signal, power source, ground etc, extend through the layer 11. The top off each terminal pin 12, at the upper surface of the layer 11, has a connecting pad 13.

The terminal pins 12 are preferably of tungsten. To improve bonding to the tungsten, the connecting pads 13 are preferably plated. In this embodiment, a 1 μm nickel layer and a 0.5 μm gold layer were used.

The wiring sheet stack 2 consists essentially of metal wiring patterns: 4, each forming a desired circuit pattern, formed on arid separated by insulating layers 3 of high dielectric constant. In the embodiment shown, each wiring pattern 4 has been fabricated onto the top surface of a respective one of the insulating layers 3 so that they form together an integrated wiring layer.

The embodiment shown has five wiring layers. However the number may vary e.g. from 1 to 20, and usually at least 2.

The insulation layers 3 preferably have a thickness between 0.1 and 500 μm, more usually 5 to 100 μm. A variety of suitable materials is well known in the art. For example, polyimide, polyamide, polyester, polysulfone, polyparabanic acid, polyhydantoin, polyetheretherketone, polyaddition-type imide, epoxy resin, phenolic resin, poly-p-hydroxystyrene polymer, fluororesin, silicone or phosphazene resin, or composites of the mentioned polymers with reinforcing materials such as glass fibres, aramid fibres or the like, are known suitable materials. Among these, polyimide is particularly preferred since it has a good combination of heat resistance, flexibility, electrical insulation and adhesive strength. Among polyimide films, a combination-type film using a condensation-type aromatic polyimide (or a precursor of such a polyimide e.g. a polyamic acid) with a polyaddition-type polyimide (e.g. an N,N'-substituted bis-maleimide) is particularly preferred.

Materials for the conductor patterns or wiring are also well known. Copper, aluminum, and gold are all suitable; copper is used most frequently. The wiring pattern is preferably formed on the preformed insulation layer (or substrate) e.g. by a metal plating method after patterning with a resist, or by an etching method for etching metal foil from a metal foil-clad insulating layer at parts other than parts intended to constitute the circuit, and which are protected by a resist.

The wiring patterns 4 of adjacent wiring layers are connected to one another through the insulating layers 3 by means of metal studs 5 extending through through-holes or vias 31. In a typical assembly, in which the area of each layer might rankle from 100 to 500 cm², there might be from 2000 to 100,000 such electrical connections per layer.

The forming of electrical connections through through-holes is per se conventional, and consequently techniques for forming the through-holes 31 are well known. The preferred technique uses an excimer laser. Usually, the diameter of the holes is between 30 and 70 μm. The holes 31 are made at locations which overlie, or will overlie when laminated on, a portion of the conductor on the layer beneath, while their tops open at or through bonding pads 41 of the exposed upper wiring pattern 4.

As can be seen in FIG. 1, each metal connecting stud 5 is a single piece which entirely fills the through-hole 31, has a bottom end 52 abutting and bonding against the conductor below in face-to-face relationship and a top end 53 which is radially spread out to form a flange 54 overlapping in contact with the bonding pad 41 of the upper wiring 4.

Most of the studs 5 abut squarely against the flat surface of the underlying wiring. Some of them, however, bond partly or entirely against the head 53 of a similar stud in the layer beneath.

The preferred material for these studs 5 is a metal having an electrical resistivity less than 3 μΩ.cm, particularly if the circuitry is intended for high-speed operation. Gold, an alloy of gold with one or more of indium, silicon, germanium and antimony, or silver, copper or aluminum, are all suitable materials having excellent conductivity, and thereby low heat generation at the pad-stud junction. They also reduce signal transmission delay while achieving good product reliability.

Methods for forming the studs 5 are now described.

FIG. 2(a) to (f) shows steps in forming and connection of a bonding pad 41 of the wiring on a first insulating layer 3 through to the connector pad 13 of one of the substrate terminal pins 12. The wiring layer is a 25 μm polyimide sheet having an 18 μm copper cladding 4' on one surface (FIG. 2(a)). The copper cladding was photoetched according to known processes to form the wiring pattern, including a bonding pad 41 (FIG. 2(b)). An excimer laser of 248 nm wavelength was used to drill through the polyimide at the locations for connection through to the substrate terminal pins, forming through-holes 31 (FIG. 2(c)).

Figure 2A:
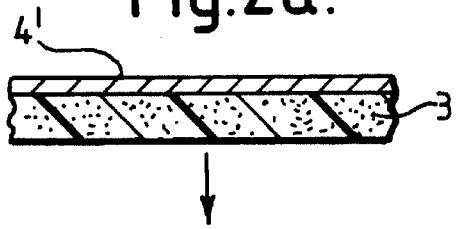
FIG. 2a–f illustrates the stamping of a stud microbump electrical connector.
Figure 2B:
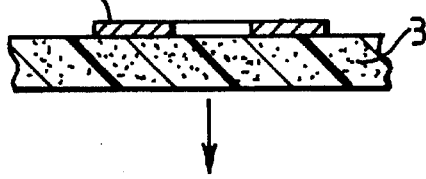
Figure 2C:
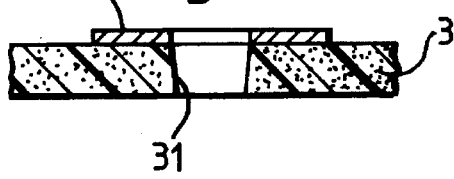
Figure 2D:
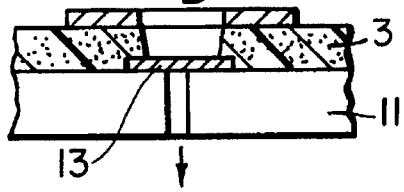
Figure 2E:
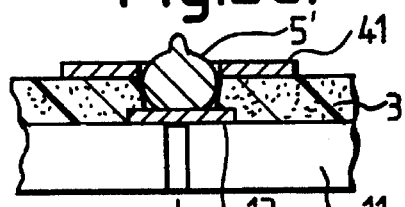

Then, a conventional alignment apparatus was used to register alignment marks on the substrate layer 11 and insulating sheet 3, and thereby superpose the substrate 1 and sheet 3 with the substrate connector pads 13 aligned with the through-holes 31 of the sheet 3. Sheet and substrate were then fixed together by conventional means to hold them in position. FIG. 2(d) shows the ensuing alignment. Then, as shown in FIG. 2(e), a metal bump or stud 5' was positioned in the through-hole 31 and bonded to the underlying connector pad 13, which had previously been prepared by nickel and gold plating, to form a metallurgical thermocompression bond using heat, pressure and ultrasound. A gold bump 5' was used in this embodiment.

Figure 2F:
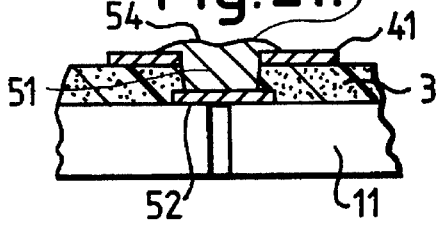

Then, the studded bump 5' was stamped from above causing its body to form a shank 51 wholly filling the through-hole 31, and its exposed end 53 to be spread into a flange 54 in overlapping contact with the bonding pad 41 of the upper wiring (FIG. 2(f)). The stamper used was connected to a heater and ultrasonic source, so that the flange 54 adhered strongly to the top bonding pad 41.

Bonding conditions for the face-to-face bonding at the bottom of the stud typically use a temperature of 150° to 400° C. in combination with ultrasonic energy, in a manner known per se for wire bonding.

The partially-formed bump or stud 5' may be introduced into the through-hole by various means. For example, lumps of suitable metal may be printed into the holes. By far the most preferred method, however, is to form and bond the studs directly into the holes 31 using a wire-bonding method, since wire-bonding techniques are suitable for use with these materials, they achieve bonds of a good strength, and the technology for accurate location of a very large number of wire-bonding operations is already available.

Figure 3A:
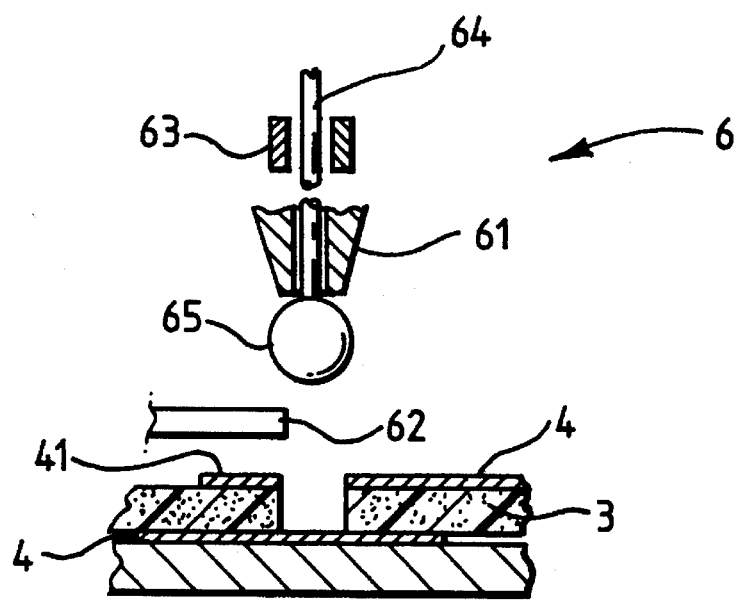
FIG. 3a–c shows a wire-bonding method for initially forming a stud.

So, as indicated in FIG. 3, a partially-formed stud 5' can be deposited using a wire-bonding head 6 having a guiding capillary 61 through which the end of a wire 64 projects, a releasable clamp 63 for releasably gripping the wire 64 above the capillary opening, and a movable electrode 62 which can be positioned adjacent the end of the wire 64 in a known manner, to form a softened ball 65 at the wire end by electrical arcing. FIG. 3(a) shows the formed ball.

Figure 3B:
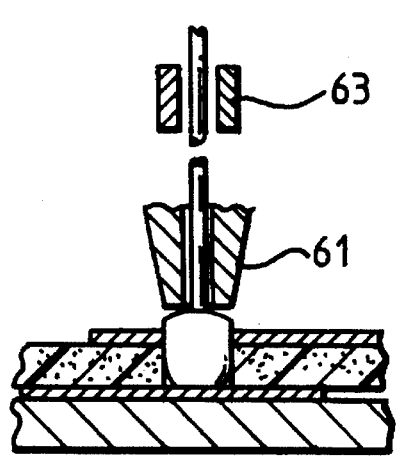

FIG. 3(b) illustrates withdrawal of the electrode 62, release of the clamp 63 and pressing of the ball 65 against the prepared bonding region by the longitudinally-drivable end of the capillary 61, which (as is conventional in wire-bonding methods) is adapted to apply heat and ultrasound energy as well as mechanical pressure. The ball is accordingly flattened and bonded onto the underlying conductor.

Figure 3C:
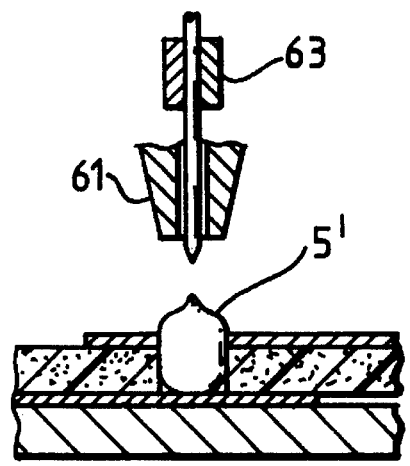

Then, as shown by FIG. 3(c), the clamp 63 grips the wire 64 again and pupils sharply upwardly to separate the bonded ball, now the part-formed stud 5', from the rest of the wire. Alternatively, this can be done by a sideways shift of the capillary 61 relative to the bonding site. The bonding head 6 then moves to the site of the next connection, in accordance with a control program.

Figure 4A:
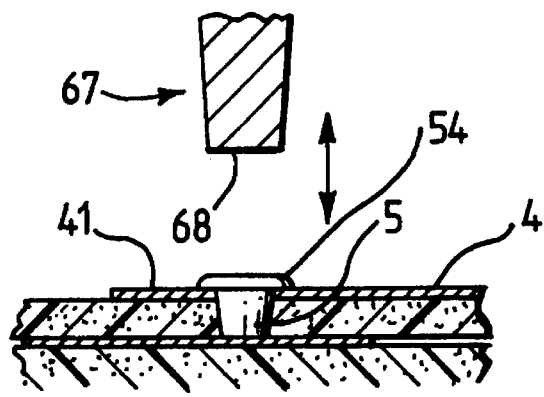
FIG. 4a–b illustrates modes of mechanical pressing of the studs.

Most preferably, the bonding machine is also provided with a stamping head 57, of the same general nature and positional controllability as the bonding capillary 61 but having a flat stamping face 68 as shown in FIG. 4(a). This is preferably connected to the heating and ultrasound sources. It stamps down on the partly-formed stud 5' to force it to fill the hole 31 and also to spread its head to form the flange 54, which is thereby bonded firmly against the upper conductive terminal 41. The flat stamping surface 68 ensures regularity and flatness of the tops of the studs, improving contact reliability and uniformity in a multi-layer structure.

It will be understood that the volume of metal to be applied for each stud should be predetermined in relation to the layer thickness and through-hole area, so that excess metal is available for spreading to form the top flange 54. Typically, a metal volume 20 to 30% greater than the volume of the through-hole 31 is used.

With wire-bonding methods, when a wire of 20 to 40 µm diameter is used, stud diameter might be e.g. 60 to 120 µm and stud height 40 to 500 µm, more usually 40 to 100 µm. Of course, this is determined in dependence on the layer thickness and through-hole size.

Figure 4B:
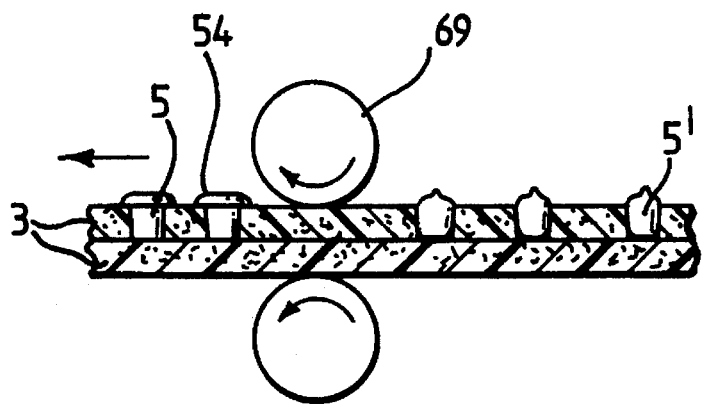

FIG. 4(b) shows schematically how, in an alternative embodiment, the tops of the part-formed studs 5' are pressed between rollers 69 of a roll press after all of the studs for a given layer have been bonded on in a part-formed state.

Figure 5:
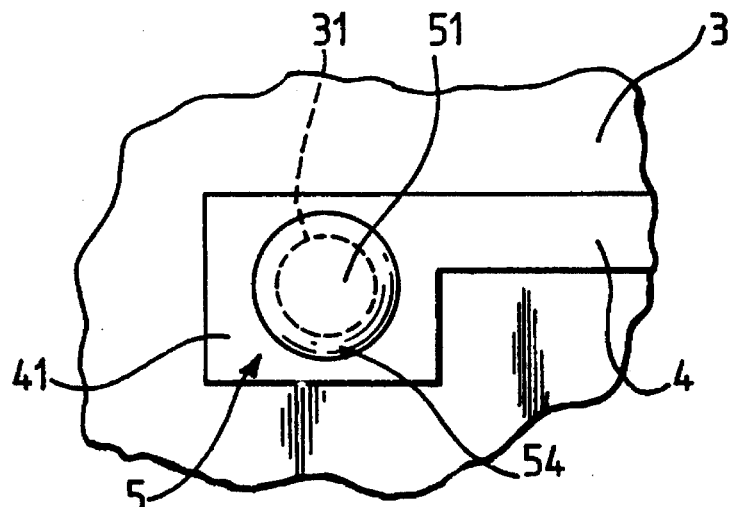
FIG. 5 is a plan view showing the spread exposed end of a stud on a bonding pad.
Figure 6A:
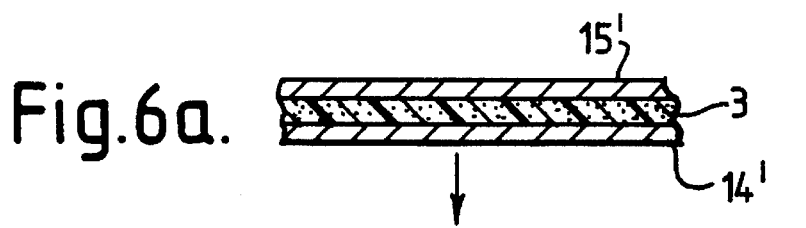
FIG. 6a–e illustrates forming of electrical connections through a duplex Cu-clad insulator sheet.
Figure 6B:
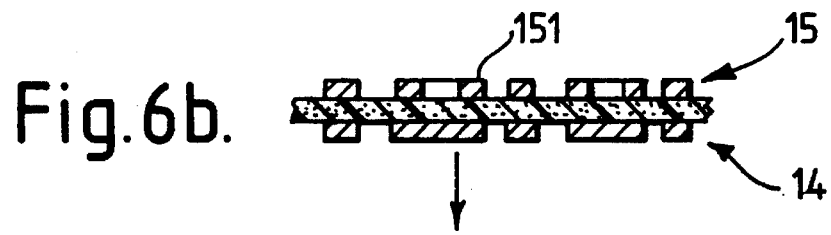
Figure 6C:
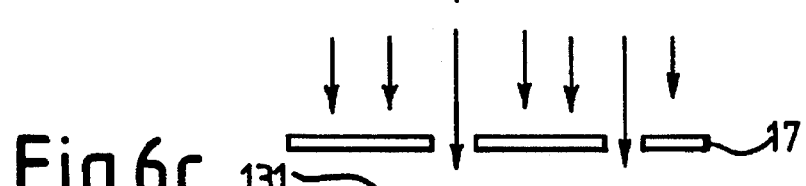
Figure 6D:
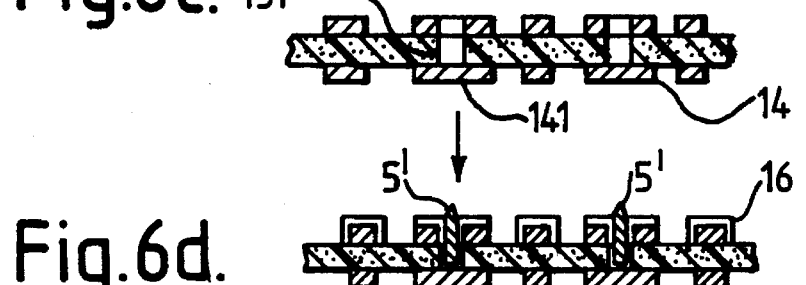
Figure 6E:
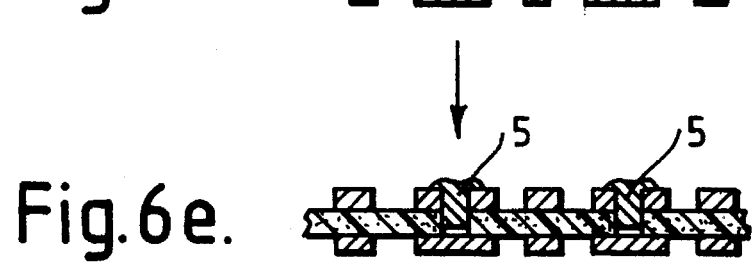

FIG. 5 shows in plan view the surface of the layer after the stud through-connection has been made at a bonding pad 41. The circular through-hole 31 is in register with a corresponding etched hole through the bonding pad 41 of the wiring 4, and is occupied by the shank 51 of the metal stud 5. The flange 54 at the top of the stud spreads to overlap the bonding pad 41, but without extending beyond the pad edges. The thickness of the spread flange will usually be between 3 and 40 µm. However, usually it should not be thicker than the underlying insulating layer 3, otherwise there may be problems in applying subsequent layers.

By repeating the process described above in relation to one or more subsequent wiring layers, an assembly as shown in FIG. 1 can be created for any desired number of layers. It will be understood that the insulating layers 3 need not necessarily be Cu-clad, pre-etched and predrilled before application to the underlying structure. The method is applicable for any mode of formation of the structure e.g. methods in which insulating layers are formed in situ from a liquid precursor and wiring is then deposited on their surfaces.

By way of comparison, we compared the metallurgical bonding strength of studs formed as described above, using gold wire and a wire-bonding technique, with soldered bumps of the conventional type. In the tests, a test substructure consisted of a silicon substrate, a 10 µm polyimide layer and a surface gold/nickel plating. Gold bumps of diameter between 80 and 100 µm were bonded between this stiff substructure and a flexible polyimide sheet also having gold/nickel plating. The flexible sheet was peeled perpendicularly away from the substructure, and the peeling force measured by a strain gauge. We found that the measured bonding strength between the layers ranged from 40 to 70 g per bump, compared with 5 to 15 g per bump for a conventional solder connection.

FIG. 6 shows the method applied to a duplex Cu-clad polyimide sheet, comprising a central polyimide layer 3' having similar lower and upper copper foil claddings 14', 15' on its two surfaces. Photo-etching was used to preform wiring patterns 14, 15 on the surfaces (FIG. 6(b)), followed by drilling of through-holes 131 at predetermined locations, corresponding to holes in bonding pads 151 of the top wiring layer 15, but overlying continuous portions 141 of the lower wiring layer 14 (FIG. 6(c)). The holes 131 are drilled by excimer laser through a masking window 17. To improve bonding strength on the contact surfaces of the wiring patterns, these surfaces are selectively plated with nickel and gold plating 16. Gold studs 5' were then stamped into the through-holes 131, by a suitable method as described above (FIG. 6(d)), and then stamped to flatten their upper ends into good contact with the upper bonding pads 151 and thereby form effective stud connectors 5.

Figure 7:
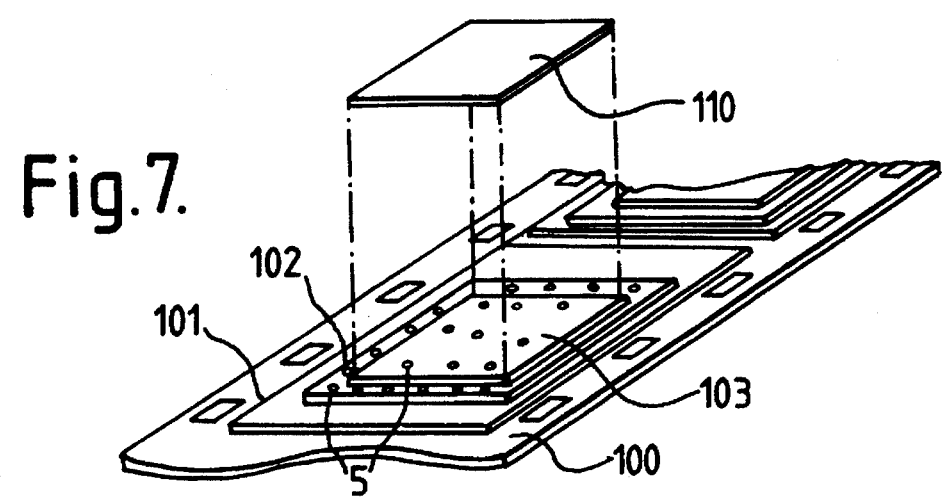
FIG. 7 shows schematically, in perspective, a thin-film assembly board with an LSI mounted thereon.

FIG. 7 shows the present techniques applied to multilayer tape automated bonding (TAB). On an underlying Cu-polyimide sheet 100 a grounding layer 101, power source layer 102 and signal layer 103 are formed successively. An LSI 110 is bonded down onto the connection terminals of the signal layer by conventional means. Conventionally, bonding between the respective layers of such constructions has been by batch bonding with a heating tool, or by a single bonding process. Metallic connections have been previously established by plating or printing solder lumps or pieces. In the present embodiment, wire-bonding techniques as described above are used to form electrical connecting studs and thereby eliminate printing or plating processes. The wire-bonded studs can then be directly stamped to form the interconnections, enabling a reliable multilayer TAB to be made at low cost.

Thus, the present invention is applicable not only to wiring board construction in thin film multilayer high-density packaging modules for use in mainframe computers, but also to other applications such as large-scale printed boards, multilayer TABs and the like.

We claim:

1. A method of making an electrical connection in the manufacture of a wiring sheet assembly, comprising:
   (a) positioning an insulator sheet between a first conductor and a second conductor;
   (b) forming a through-hole through the second conductor and the insulator sheet and overlying the first conductor;
   (c) inserting a metallic stud through the through-hole and into contact with the first conductor;
   (d) bonding the metallic stud onto the first conductor, while heaving an end of the metallic stud exposed above the second conductor; and
   (e) flattening the exposed end of the metallic stud to spread said exposed end in peripheral contact with the second conductor.

2. A method as claimed in claim 1 in which the metallic stud comprises a metal wire, and step (d) comprises:
   bonding an end portion of the metal wire onto the first conductor; and
   separating the bonded portion of the metal wire from the rest of the wire to leave the exposed end of the bonded portion exposed adjacent the second conductor.

3. A method as claimed in claim 1 in which step (e) comprises stamping the exposed end of the metallic stud.

4. A method as claimed in claim 1 in which step (e) comprises rolling the exposed end of the metallic stud.

5. A method as claimed in claim 1 in which step (e) forms an outward flange of the metallic stud which overlaps the second conductor.

6. A method according to claim 1 in which the metallic stud has a resistivity less than 3 $\mu\Omega$.cm.

7. A method according to claim 1, in which step (d) includes metallurgically bonding a first end of the metallic stud onto the first conductor.

8. A method as claimed in claim 1, wherein steps (c) and (d) comprise inserting a first end of the metallic stud through the through-hole and into contact with the first conductor, and bonding the first end onto the first conductor.

9. A method of making a wiring sheet assembly comprising:
   (a) forming a first conductor pattern on an underlying layer;
   (b) providing a first insulator sheet and, in any order,
      (i) forming a second conductor pattern on the first insulator sheet;
      (ii) forming through-holes into the first insulator sheet at a first plurality of predetermined connection locations; and
      (iii) superimposing the first insulator sheet on the first conductor pattern; whereby the through-holes of the first insulator sheet overlie portions of the first conductor pattern;
   (c) bonding metallic studs onto the first conductor pattern through the through-holes of the first insulator sheet at said first plurality of predetermined connection locations; and
   (d) stamping the metallic studs bonded to the first conductor pattern, to form outward flanges thereof in overlapping contact with the second conductor pattern.

10. A method as claimed in claim 9 in which the underlying layer is an assembly substrate, and the first conductor pattern comprises connector terminals on the assembly substrate.

11. A method as claimed in claim 9 in which the underlying layer is In underlying insulator sheet.

12. A method as claimed in claim 9 in which, for each metallic stud, step (c) comprises:
   bonding an end portion of a metal wire onto the first conductor pattern; and
   separating the bonded end portion of the metal wire from the rest of the wire.

13. A method as claimed in claim 9 in which each metallic stud has a resistivity less than 3 $\mu\Omega$.cm.

14. A method as claimed in claim 9, further comprising:
   (e) providing a further insulator sheet, and, in any order,
      (i) forming a further conductor pattern on the further insulator sheet;
      (ii) forming through-holes into the further insulator sheet at a further plurality of predetermined connection locations; and
      (iii) superimposing the further insulator sheet on the second conductor pattern; whereby the through-holes of the further insulator sheet overlie portions of the second conductor pattern;
   (f) bonding metallic studs onto the second conductor pattern through the through-holes of the further insulator sheet at said further plurality of predetermined connection locations; and
   (g) stamping the metallic studs bonded to the second conductor pattern, to form outward flanges thereof in overlapping contact with the further conductor pattern.

15. A method as claimed in claim 9, wherein step (c) comprises inserting a first end of each metallic stud through the through-holes and into contact with the first conductor pattern, and bonding the first ends to the first conductor pattern.

16. A method of making an electrical connection in the manufacture of a wiring sheet assembly, comprising:
   (a) providing a first conductor and a second conductor, separated by an insulator sheet, with a through-hole extending through the insulator sheet and overlying the first conductor;
   (b) applying heat and ultrasound to bond a metallic stud onto the first conductor to extend through the through-hole, with an exposed end thereof adjacent the second conductor; and
   (c) flattening the exposed end of the metallic stud to spread said exposed end in peripheral contact with the second conductor.

17. A method of making an electrical connection in the manufacture of a wiring sheet assembly, comprising:
   (a) providing a first conductor and a second conductor, separated by an insulator sheet, with a through-hole extending through the insulator sheet and overlying the first conductor;
   (b) applying heat and ultrasound to bond an end portion of a metal wire onto the first conductor to extend through the through-hole;
   separating the bonded end portion of the metal wire from the rest of the wire to form a metallic stud with an exposed end thereof adjacent the second conductor; and (c) flattening the exposed end of the metallic stud to spread said exposed end in peripheral contact with the second conductor.

18. A method as claimed in claim 17 in which the end portion of the metal wire is bonded onto the first conductor by a wire-bonding machine.

19. A method of making an electrical connection in the manufacture of a wiring sheet assembly, comprising in sequence the steps of:

(a) positioning an insulator sheet between a first conductor and a second conductor;

(b) forming a through-hole through the second conductor and the insulator sheet and overlying the first conductor;

(c) inserting a metallic stud through the through-hole and into contact with the first conductor;

(d) bonding the metallic stud onto the first conductor, while leaving an end of the metallic stud exposed above the second conductor; and (e) flattening the exposed end of the metallic stud to spread said exposed end in peripheral contact with the second conductor.

20. A method of making an electrical connection in the manufacture of a wiring sheet assembly, comprising:

(a) positioning an insulator sheet between a first conductor and a second conductor;

(b) forming a through-hole through the second conductor and the insulator sheet and directly overlying the first conductor;

(c) inserting a metallic stud through the through-hole and into contact with the first conductor;

(d) bonding the metallic stud onto the first conductor, while leaving an end of the metallic stud exposed above the second conductor; and (e) flattening the exposed end of the metallic stud to spread said exposed end in peripheral contact with the second conductor.

* * * * *